United States Patent
Schulte et al.

(10) Patent No.: US 7,820,305 B2
(45) Date of Patent: Oct. 26, 2010

(54) ELECTROLUMINESCENT POLYMERS

(75) Inventors: Niels Schulte, Kelkheim (DE); Susanne Heun, Bad Soden (DE); Ingrid Bach, Hofheim (DE); Philipp Stössel, Frankfurt (DE); Kevin Treacher, Northwich (GB)

(73) Assignee: Merck Patent GmbH, Darmstadt (DE)

( * ) Notice: Subject to any disclaimer, the term of this patent is extended or adjusted under 35 U.S.C. 154(b) by 846 days.

(21) Appl. No.: 11/631,584

(22) PCT Filed: Jul. 6, 2005

(86) PCT No.: PCT/EP2005/007290

§ 371 (c)(1), (2), (4) Date: Jan. 4, 2007

(87) PCT Pub. No.: WO2006/003000

PCT Pub. Date: Jan. 12, 2006

(65) Prior Publication Data

US 2007/0281182 A1     Dec. 6, 2007

(30) Foreign Application Priority Data

Jul. 6, 2004    (DE)    .................. 10 2004 032 527

(51) Int. Cl.
| | |
|---|---|
| B32B 9/00 | (2006.01) |
| C08G 79/00 | (2006.01) |
| C08G 61/00 | (2006.01) |
| C08G 61/02 | (2006.01) |
| C07F 15/00 | (2006.01) |
| C09K 11/06 | (2006.01) |
| H01L 51/05 | (2006.01) |
| H01L 51/30 | (2006.01) |
| H05B 33/14 | (2006.01) |

(52) U.S. Cl. .................. 428/690; 428/917; 252/301.35; 528/9; 528/485

(58) Field of Classification Search .................. 428/690, 428/917; 252/301.35; 528/9, 485
See application file for complete search history.

(56) References Cited

U.S. PATENT DOCUMENTS

| | | | |
|---|---|---|---|
| 6,956,095 B2 | 10/2005 | Treacher et al. | |
| 6,994,893 B2 | 2/2006 | Spreitzer et al. | |
| 2002/0193532 A1 * | 12/2002 | Ikehira et al. | ............. 525/333.3 |
| 2004/0135131 A1 | 7/2004 | Treacher et al. | |
| 2004/0138455 A1 | 7/2004 | Stossel et al. | |
| 2004/0206939 A1 | 10/2004 | Spreitzer et al. | |
| 2005/0038223 A1 | 2/2005 | Becker et al. | |
| 2005/0287301 A1 | 12/2005 | Ljubomirsky | |
| 2006/0058524 A1 | 3/2006 | Falcou et al. | |
| 2006/0093852 A1 | 5/2006 | Marsitzky et al. | |
| 2006/0127696 A1 | 6/2006 | Stossel et al. | |
| 2006/0149022 A1 | 7/2006 | Parham et al. | |
| 2006/0199943 A1 | 9/2006 | Falcou et al. | |
| 2006/0229427 A1 | 10/2006 | Becker et al. | |
| 2006/0284140 A1 | 12/2006 | Breuning et al. | |
| 2007/0034863 A1 | 2/2007 | Fortte et al. | |
| 2007/0060736 A1 | 3/2007 | Becker et al. | |

FOREIGN PATENT DOCUMENTS

| | | |
|---|---|---|
| DE | 10349033 A1 | 5/2005 |
| DE | 10350606 A1 | 6/2005 |
| DE | 102004003008 A1 | 10/2005 |
| DE | 102004023278 A1 | 12/2005 |
| EP | 423283 A1 | 4/1991 |
| EP | 1138746 A1 | 10/2001 |
| EP | 1245659 A1 | 10/2002 |
| EP | 1424350 A1 | 6/2004 |
| WO | WO-02066552 A1 | 8/2002 |
| WO | WO-02068435 A1 | 9/2002 |
| WO | WO-02072714 A1 | 9/2002 |
| WO | WO-02077060 A1 | 10/2002 |
| WO | WO-03019694 A2 | 3/2003 |
| WO | WO-03020790 A2 | 3/2003 |
| WO | WO-03048225 A1 | 6/2003 |
| WO | WO-03079736 A1 | 9/2003 |
| WO | WO-03102109 A1 | 12/2003 |
| WO | WO-2004020448 A1 | 3/2004 |
| WO | WO-2004022626 A1 | 3/2004 |
| WO | WO-2004026886 A2 | 4/2004 |
| WO | WO-2004037887 A2 | 5/2004 |
| WO | WO-2004070772 A2 | 8/2004 |
| WO | WO-2004113468 A1 | 12/2004 |
| WO | WO-2005014688 A1 | 2/2005 |
| WO | WO-2005014689 A2 | 2/2005 |
| WO | WO-2005030827 A1 | 4/2005 |
| WO | WO-2005033244 A1 | 4/2005 |
| WO | WO-2005042545 A3 | 5/2005 |

OTHER PUBLICATIONS

Baldo, M. A. et al., "Very high efficiency green organic light-emitting devices based on electrophosphorescence", Applied Physics Letters, 1999, vol. 75, No. 1, pp. 4-6.

* cited by examiner

*Primary Examiner*—Duc Truong
(74) *Attorney, Agent, or Firm*—Connolly Bove Lodge & Hutz LLP

(57) ABSTRACT

The present invention relates to phosphorescent copolymers comprising trifunctional triplet emitters. The polymers according to the invention are highly soluble, readily accessible synthetically and more suitable for use in organic light-emitting diodes than are comparative materials in accordance with the prior art.

36 Claims, No Drawings

ELECTROLUMINESCENT POLYMERS

RELATED APPLICATIONS

This application is a national stage application (under 35 U.S.C. 371) of PCT/EP2005/007290 filed Jul. 6, 2005, which claims the benefit of German application 10 2004 032 527.8 filed Jul. 6, 2004.

Broadly based research into the commercialisation of display and illumination elements based on polymeric (organic) light-emitting diodes (PLEDs) has been under way for about 13 years. This development was triggered by the fundamental developments disclosed in EP 423 283. First products in the form of relatively small displays (in a shaver and a mobile telephone from Philips Nev.) have recently also been available on the market.

A development which has been evident for a few years, especially in the area of "small-molecule" displays, is the use of materials which are able to emit light from the triplet state and thus exhibit phosphorescence instead of fluorescence (M. A. Baldo et al., *Appl. Phys. Lett.* 1999, 75, 4-6), enabling an up to four-fold energy and power efficiency. The main conditions which may be mentioned here for practical utility are, in particular, the efficient light emission, a long lifetime and the good synthetic accessibility of the compounds.

Recently, efforts have increasingly been made also to utilise the advantages of the vapour-depositable triplet emitters for polymer applications. Thus, so-called hybrid device structures are being considered which combine the advantages of small-molecule OLEDs with those of polymer OLEDs (=PLEDs) and are formed by mixing the triplet emitter into the polymer. However, it is more advantageous to incorporate the triplet emitter into a polymer, since the risk of phase separation during device production and operation is thus avoided. Both methods have the advantage that the compounds can be processed from solution and that an expensive and complex vapour-deposition process, as for devices based on low-molecular-weight compounds, is not necessary. Application from solution (for example by means of high-resolution printing processes) will in the long term have significant advantages over the vacuum-evaporation process that is common today, especially with respect to scalability, structurability, coating efficiency and economy.

In spite of the advances achieved recently, there is still considerable potential for improvement in the area of polymeric triplet emitters. A significant need for improvement can furthermore be seen, inter alia, in the following areas:

(1) The efficiency of the electroluminescent elements must be improved further. The fact that higher efficiency is possible in principle is shown by the results of electroluminescent elements based on small molecules applied under reduced pressure.
(2) The operating voltage of the electroluminescent elements is too high for high-quality electronic applications.
(3) The lifetime of electroluminescent elements is to date still inadequate for high-quality electronic applications.
(4) The synthetic accessibility of phosphorescent polymers comprising covalently bonded triplet emitters is hitherto only possible by very complex methods. Thus, it is hitherto necessary to synthesise mono- or bifunctionalised triplet emitters which, for example in the case of the most widespread materials based on tris-ortho-metallated iridium complexes, are only accessible in multistep synthetic processes and not always in satisfactory yields. Simple and resource-conserving utilisation of these rare metals is thus hitherto not possible.

It is thus apparent that there continues to be a major need for improvement in the area of polymer-bonded triplet emitters.

WO 02/068435 describes mono-, di- and trihalogenated iridium complexes which can also be employed as monomers for the synthesis of polymers. However, it is not indicated which of these complexes are preferably suitable for this purpose, and it must consequently be assumed that the monohalogenated complexes here are suitable for incorporation into the side chain and the dihalogenated complexes for incorporation into the main chain, while the trihalogenated complexes should result in insoluble polymers due to crosslinking.

WO 02/077060 and WO 03/020790 describe copolymers which comprise spirobifluorene units and which may additionally also comprise metal complexes which are able to emit light from the triplet state and thus exhibit phosphorescence instead of fluorescence. Metal complexes which have two links to the polymer and are thus incorporated into the polymer main chain are described and depicted as the preferred embodiment. However, the structures shown here have the disadvantage that this requires asymmetrical metal complexes, which are not readily accessible synthetically. However, it cannot be concluded from the description that other metal complexes which are not incorporated in a linear manner into the polymer main chain offer particular advantages for electroluminescence.

Also known are dendrimers which emit light from the triplet state, as described, for example, in WO 02/066552, WO 03/079736 and WO 04/020448, which can be processed from solution just like polymers. However, these dendrimers have the crucial disadvantage that their synthetic accessibility is extremely complex since the individual generations of the dendrimer have to be built up in separate reaction steps and in each case isolated and purified. The yields are consequently low, and large losses of the rare metals used are suffered. The use of these dendrimers thus does not offer a true alternative to phosphorescent polymers, which can be built up in a single synthetic step.

The object was therefore to show how phosphorescent polymers which exhibit good electroluminescent properties can be built up easily and from synthetically readily accessible compounds, with compatibility with conventional polymerisation techniques in the sense of a one-pot process being aimed at.

Surprisingly, it has been found that—hitherto unknown—phosphorescent copolymers which have branches at the triplet emitters have significant improvements compared with polymers and mixtures in accordance with the prior art, in particular high emission efficiency, low operating voltage and a long lifetime at the same time as simple synthetic accessibility and good solubility. This is particularly surprising since it was expected that the copolymers are insoluble owing to the branches (and consequently crosslinking) and cannot be processed from solution. It is furthermore surprising that these polymers exhibit phosphorescence or electrophosphorescence at all since related polymers exhibit fluorescence or electrofluorescence. The present application therefore relates to these phosphorescent copolymers.

Related fluorescent copolymers which have branches in the polymer chain have already been described in the literature (EP 1138746). These branches can also be produced, inter alia, by metal complexes. However, these compounds are only described inadequately in this patent application, and it is consequently not evident from the description how they can usefully be built up and employed. Since they are fluorescent and not phosphorescent polymers, it appears that the metal complexes were only employed as structural branching points, but did not achieve electronic importance in the polymer. It is also not evident from the examples given why these polymers in particular are said to have particularly good properties. Thus, although the in this case very complex synthesis of the fluorescent polymers which comprise tris(phenylpyridyl)iridium(III) complexes incorporated into the main chain, as end group and as branch, is described, no physical properties of the polymers are indicated, and it must consequently be assumed that although these polymers possibly exhibit improved Theological properties, they do not give outstanding results in fluorescence or in electrofluorescence. Thus, the combination of 9,9-dioctylfluorene as backbone with unsubstituted tris(phenylpyridine)iridium(III) does not appear to be suitable for the synthesis of phosphorescent polymers.

EP 1245659 describes polymers which comprise in the main or side chain metal complexes which are able to emit light from the triplet state and thus exhibit phosphorescence instead of fluorescence. According to general understanding, it can be assumed here that these are primarily linear polymers. It is not evident from the description that it could be preferred for the metal complexes to have branches. On the contrary, the examples mention the identical polymers as in the above-cited patent EP 1138746, of which it was already described therein that they exhibit fluorescence and not phosphorescence. A misleading teaching is thus provided, and it can be concluded that the use of metal complexes as branching point is unsuitable for the construction of phosphorescent polymers.

The invention relates to phosphorescent copolymers comprising at least 0.01 mol % of at least one triplet emitter, characterised in that the triplet emitter has at least three links to the polymer, with the proviso that the polymer does not comprise 9,9-dioctylfluorene if the triplet emitter is an unsubstituted tris(phenylpyridine)iridium(III).

For the purposes of this invention, phosphorescence is taken to mean luminescence stimulated by external energy, for example light or electric current, in which the emission is generated by a transition from a triplet state or a mixed state comprising an excited singlet state and a triplet state into the singlet ground state. By contrast, fluorescence for the purposes of this invention is taken to mean luminescence stimulated by external energy in which the emission is generated by a transition from an excited singlet state into the singlet ground state. These two processes can be distinguished experimentally by the lifetimes of the excited states, where the lifetime of the excited singlet state is in the order of $10^{-10}$ to $10^{-7}$ s and that of the triplet state is in the order of $>10^{-7}$ s, which can be determined by time-resolved luminescence spectroscopy. For the purposes of this invention, a triplet emitter is intended to be taken to mean a compound, in particular a metal complex, which emits light from the triplet state at room temperature in electroluminescence, i.e. exhibits electrophosphorescence instead of electrofluorescence. Suitable for this purpose are, in particular, metal complexes which contain at least one metal having an atomic number of greater than 38, where not all polymers which comprise such metal complexes are consequently inevitably capable of exhibiting phosphorescence.

The at least three links of the triplet emitter to the polymer can be obtained by employing an at least trifunctionalised triplet emitter, which results in branching of the polymer.

The phosphorescent copolymers according to the invention are distinguished from the above-mentioned dendrimers in that the branches are arranged randomly in the polymer, while they are in a regular arrangement in the dendrimer. The synthesis is consequently considerably simplified compared with dendrimers since a one-pot synthesis is possible. Furthermore, each recurring unit in the dendrimer has a branch, while only some of the recurring units in the polymer according to the invention, preferably only the triplet emitter, have branches. They are furthermore distinguished from the above-mentioned branched polymers (EP 1138746), whose branching points are described by metal complexes, through the fact that they phosphoresce and do not fluoresce. The copolymers according to the invention consequently exhibit significantly higher efficiencies in electroluminescence than the corresponding fluorescent polymers which comprise the metal complexes merely as branching points without electronic influence.

The phosphorescent copolymer according to the invention may be conjugated, partially conjugated or non-conjugated. The copolymer according to the invention is preferably conjugated or partially conjugated.

For the purposes of this invention, conjugated polymers are polymers which contain in the main chain principally $sp^2$-hybridised (or also sp-hybridised) carbon atoms, which may also be replaced by corresponding hetero atoms. In the simplest case, this means the alternating presence of double and single bonds in the main chain. Principally means that defects occurring naturally (without further assistance) which result in conjugation interruptions do not devalue the term "conjugated polymer". Furthermore, the term conjugated is likewise used in this application text if arylamine units, arylphosphine units and/or certain heterocycles (i.e. conjugation via N, O, S or P atoms) and/or organometallic complexes, such as, for example, iridium complexes (conjugation via the metal atom), are located in the main chain. For the purposes of this invention, partially conjugated polymers are polymers which either contain in the main chain relatively long conjugated sections interrupted by non-conjugated sections or contain relatively long conjugated sections in the side chains of a polymer which is non-conjugated in the main chain. By contrast, units such as, for example, simple alkylene chains, (thio)ether bridges, keto groups, ester, amide or imide links would clearly be defined as non-conjugated segments.

The phosphorescent copolymers according to the invention may comprise various further structural elements in addition to the triplet emitter. These may be, inter alia, structural elements which form the polymer backbone or those which influence the charge-injection or charge-transport properties. Such units are described in detail, for example, in WO 03/020790 and WO 05/014689. Structural elements which ensure efficient excitation transfer, such as further copolymerised dyes, are also possible.

Preferred structural elements which can be used as polymer backbone are, for example, fluorene derivatives, spirobifluorene derivatives, 9,10-dihydrophenanthrene derivatives, 4,5-dihydropyrene derivatives, 4,5,9,10-tetrahydropyrene derivatives, phenanthrene derivatives and cis- and trans-indenofluorene derivatives, each of which may be substituted or unsubstituted. Particularly preferred structural elements which can be used as polymer backbone are spirobifluorene derivatives, phenanthrene derivatives and cis- and trans-indenofluorene derivatives, very particularly preferably spirobifluorene derivatives and phenanthrene derivatives, where furthermore very good results and very efficient phosphorescence are achieved if these units are used in combination with other backbone units. If spirobifluorene derivatives are used as backbone, these are preferably substituted by alkyl chains.

Preferred structural elements which have hole-transport properties are, for example, triarylamine derivatives, benzidine derivatives, tetraarylene-para-phenylenediamine derivatives, triarylphosphine derivatives, phenothiazine derivatives, phenoxazine derivatives, dihydrophenazine derivatives, thianthrene derivatives, dibenzo-p-dioxin derivatives, phenoxathiyne derivatives, carbazole derivatives, azulene derivatives, thiophene derivatives, pyrrole derivatives, furan derivatives and further O-, S- or N-containing heterocycles having a high HOMO (HOMO=highest occupied molecular orbital); these arylamines and heterocycles preferably result in an HOMO in the polymer of less than 5.8 eV (against vacuum level), particularly preferably of less than 5.5 eV.

Preferred structural elements which have electron-transport properties are, for example, pyridine derivatives, pyrimidine derivatives, pyridazine derivatives, pyrazine derivatives, anthracene derivatives, pyrene derivatives, triarylboranes, oxadiazole derivatives, quinoline derivatives, quinoxaline derivatives, phenazine derivatives and further O-, S- or N-containing heterocycles having a low LUMO (LUMO=lowest unoccupied molecular orbital); these units preferably result in an LUMO in the polymer of greater than 2.7 eV (against vacuum level), particularly preferably of greater than 3.0 eV.

The copolymers may furthermore preferably also comprise structural elements which ensure efficient excitation transfer and improve the transition from the singlet state to the triplet state. Suitable for this purpose are, for example, carbazole units (for example as described in WO 04/070772 and WO 04/113468), keto-, phosphine oxide- or sulfoxide-containing structural elements (for example as described in the unpublished applications DE 10349033.7 and DE 102004003008.1) or arylsilane units (for example as described in the unpublished application DE 102004023278.4). Units which improve the transition from the singlet state to the triplet state may also be those which are themselves also able to emit from the singlet state or from the triplet state; these may be linear or likewise branched. Preference is given to the use of keto or phosphine oxide units, in particular those which are substituted by aromatic groups. Particular preference is given to the use of aromatic keto units, for example benzophenone.

The invention furthermore relates to white-emitting copolymers in which the white emission is a combination of the emission from blue-, green- and red-emitting units, characterised in that at least one of the emitting units is a triplet emitter which has at least three links to the polymer.

The copolymers according to the invention may have random, alternating or also block-like structures or also have a plurality of these structures in an alternating arrangement. Electronic properties, such as, for example, charge transport, can consequently be adjusted, but the morphology of the polymer can also be influenced by different spatial arrangement of the branching points. The synthesis of copolymers having block-like structures is described, for example, in WO 05/014688.

The molecular weight $M_w$ of the polymers is between $10^3$ and $10^7$ g/mol, preferably between $10^4$ and $10^6$ g/mol, particularly preferably between $5 \cdot 10^4$ and $8 \cdot 10^5$ g/mol.

The copolymers according to the invention are prepared by polymerisation of corresponding monomers, where at least one monomer comprises the trifunctionalised or polyfunctionalised triplet emitter or a corresponding ligand for coordination of the metal. In particular for the synthesis of conjugated and partially conjugated polymers, some types have proven successful here, all of which result in C—C links (SUZUKI coupling, YAMAMOTO coupling, STILLE coupling). The way in which the polymerisation can be carried out by these methods and the way in which the polymers can be separated off from the reaction medium and purified are described, for example, in WO 03/048225 or in WO 04/022626. The synthesis of non-conjugated polymers can also be carried out by these methods by using corresponding monomers which are not continuously conjugated. For partially conjugated or non-conjugated polymers, other synthetic methods are also suitable, as are generally familiar from polymer chemistry, such as, for example, polycondensations in general or cationic, anionic or free-radical polymerisations. It may also be appropriate to employ monofunctional compounds in the polymerisation reaction. On the one hand, this enables the molecular-weight range of the polymer to be adjusted. On the other hand, the trifunctional or polyfunctional compounds (trifunctional or polyfunctional triplet emitters) likewise used can be compensated for via monofunctional compounds.

The occurrence of branches in the phosphorescent copolymers according to the invention can be demonstrated, for example, via the molecular-weight distribution (determined via GPC). While polydispersities in the range from 2.5 to 4 are generally found in the polycondensation of a linear polymer by the SUZUKI method under the reaction conditions selected here, the polydispersities of the phosphorescent copolymers according to the invention are in the range from 5 to 6 and are thus significantly higher than for the linear polymers, as would also be expected for branched polymers.

In the synthesis of the phosphorescent polymers, the correspondingly trifunctionalised or polyfunctionalised triplet emitter can be employed directly as monomer. However, it is also possible to employ a correspondingly substituted ligand in the polymerisation reaction and to carry out the complexing of the metal on the ready-synthesised polymer or oligomer. Since polymer-analogous reactions are generally difficult to carry out and in particular purification of the polymers after the reaction is difficult or impossible, it is preferred to employ the trifunctionalised or polyfunctionalised triplet emitter as monomer.

It has been found that a proportion of 0.01-50 mol %, preferably 0.05-10 mol %, particularly preferably 0.1-5 mol %, in particular 0.5-3 mol %, of the triplet emitter exhibits good results, where the data are based on all the recurring units present in the polymer. This is a surprising result since in accordance with the prior art the proportion of the triplet emitter in copolymers and blends is significantly higher in order to achieve efficient phosphorescence. With the polymers according to the invention, very good results are achieved with this low proportion of the triplet emitter, and the processability of the polymers is good, which is not always the case with a higher proportion of the triplet emitter.

It has furthermore been found that it is preferred for at least 20% of the triplet emitters, preferably at least 30% of the triplet emitters, particularly preferably at least 50% of the triplet emitters, in particular predominantly all the triplet emitters employed, to have at least three links to the polymer chain, particularly preferably precisely three links to the polymer chain, and thus represent branching points. In addition, it is preferred for only the triplet emitters and no further units in the polymer to have branches.

The triplet emitters bonded in the phosphorescent copolymer are preferably organometallic complexes. An organometallic compound is intended to be taken to mean a compound which has at least one direct metal-carbon bond. Preference is furthermore given to electrically neutral triplet emitters and electrically neutral copolymers.

The triplet emitters preferably comprise only chelating ligands, i.e. ligands which coordinate to the metal via at least two bonding sites; particular preference is given to the use of two or three bidentate ligands, which may be identical or different. The preference for chelating ligands is due to the higher stability of chelate complexes.

The triplet emitter in the polymer preferably has a structure of the formula (1)

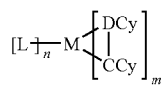

Formula (1)

where the following applies to the symbols and indices used:

M is on each occurrence, identically or differently, a main-group metal, transition metal or lanthanoid having an atomic number>38;

DCy is on each occurrence, identically or differently, a cyclic group which contains at least one donor atom, i.e. an atom having a free electron pair, preferably nitrogen or phosphorus, via which the cyclic group is bonded to the metal and which may carry one or more substituents $R^1$; the groups DCy and CCy are bonded to one another via a covalent bond and may also have further links to one another via the radicals $R^1$ and $R^2$;

CCy is on each occurrence, identically or differently, a cyclic group which contains a carbon atom via which the cyclic group is bonded to the metal and which may carry one or more substituents $R^1$;

L is on each occurrence, identically or differently, a bidentate-chelating ligand, preferably a monoanionic, bidentate-chelating ligand;

$R^1$ is on each occurrence, identically or differently, H, F, Cl, Br, I, $NO_2$, CN, a straight-chain, branched or cyclic alkyl or alkoxy group having 1 to 40 C atoms, in which one or more non-adjacent $CH_2$ groups may be replaced by C=O, C=S, C=Se, C=$NR^2$, $-R^2C=CR^2-$, $-C\equiv C-$, $-O-$, $-S-$, $-NR^2-$, $Si(R^2)_2$ or $-CONR^2-$ and in which one or more H atoms may be replaced by F, Cl, Br, I, CN, $NO_2$, or an aromatic or heteroaromatic ring system having 5 to 40 aromatic ring atoms, which may be substituted by one or more non-aromatic radicals $R^1$; a plurality of substituents $R^1$ here, both on the same ring and also on the two different rings, may together in turn define a further mono- or polycyclic, aliphatic or aromatic ring system;

$R^2$ is, identically or differently on each occurrence, H or an aliphatic or aromatic hydrocarbon radical having 1 to 20 C atoms;

m is on each occurrence 1, 2 or 3, preferably 2 or 3, particularly preferably 3;

n is on each occurrence 0, 1 or 2, preferably 0 or 1, particularly preferably 0;

the unit of the formula (1) has at least three links to the polymer.

The linking to the polymer can take place via one or more ligands, preferably via at least two ligands, particularly preferably via three ligands or via four ligands.

Preference is likewise given to polycyclic triplet emitters and metal clusters whose common feature is more than one metallic centre.

The units of the formula (1) may have a symmetrical or asymmetrical structure. In a preferred embodiment of the invention, the units of the formula (1) have a symmetrical structure. This preference is due to the easier synthetic accessibility of the compounds. Thus, units of the formula (1) can preferably be homoleptic metal complexes, i.e. metal complexes which have only one type of ligand.

In a further preferred embodiment of the invention, the units of the formula (1) have an asymmetrical structure. This may offer advantages in the emission properties if the emission comes from only one of the ligands. Thus, units of the formula (1) can preferably be heteroleptic complexes, i.e. metal complexes which have more than one different ligand.

Preferred metals M are selected from the group of the transition metals having an atomic number>38; particularly preferred metals M are selected from the group of the transition metals having an atomic number>50; very particularly preferred metals are selected from the elements tungsten, rhenium, ruthenium, osmium, rhodium, iridium, palladium, platinum and gold, in particular iridium and platinum.

The triplet emitter is incorporated covalently into the polymer chain. In order to facilitate incorporation of the complex into the polymer, functional polymerisable groups must be present on the complex. It may be preferred here firstly to build up the complete complex and to carry out the functionalisation thereon, for example by halogenation. It may likewise be preferred to carry out the functionalisation on the ligand and to carry out the complexing with the functionalised ligand. Examples of corresponding brominated complexes which can be employed as monomers in polycondensation reactions (for example by the SUZUKI or YAMAMOTO method) and the syntheses thereof are described in WO 02/068435.

It may also be preferred to admix further conjugated, partially conjugated or non-conjugated polymers, oligomers, dendrimers or low-molecular-weight compounds with the phosphorescent polymer. The addition of further components may prove appropriate for some applications; thus, for example, addition of an electronically active substance enables the hole or electron injection or the hole or electron transport to be improved in the corresponding blend. The additional component may also improve the singlet-triplet transfer or itself emit light. The addition of electronically inert compounds may also be helpful in order, for example, to control the viscosity of a solution or the morphology of the film formed. The present invention likewise relates to the resultant blends.

The invention furthermore relates to solutions and formulations of one or more phosphorescent copolymers or blends according to the invention in one or more solvents. The way in which polymer solutions can be prepared is described, for example, in WO 02/072714, in WO 03/019694 and in the literature cited therein. These solutions can be used in order to produce thin polymer layers, for example by area-coating methods (for example spin coating) or printing processes (for example ink-jet printing).

The phosphorescent copolymers according to the invention can be used in PLEDs, in particular as electroluminescent materials (=emitting materials). For the construction of PLEDs, use is generally made of a general process which should be adapted correspondingly for the individual case. A process of this type has been described in detail, for example, in WO 04/037887. These PLEDs generally also comprise at least one hole-injection layer, for example comprising PEDOT (doped polyethylene-dioxythiophene); the use of an interlayer between the emitting layer and the hole-injection layer may also prove appropriate, for example in order to increase the lifetime.

The invention therefore also relates to the use of a phosphorescent copolymer according to the invention in a PLED.

The invention likewise relates to a PLED having one or more layers, where at least one of these layers comprises at least one phosphorescent copolymer according to the invention.

The phosphorescent copolymers according to the invention have the following surprising advantages over the prior art:

- The efficiency of the light emission by the triplet emitter is comparable or better in copolymers according to the invention compared with copolymers in accordance with the prior art. This is the case, in particular, compared with the branched copolymers mentioned in EP 1138746, which exhibit fluorescence, where the latter do not originate from the metal complex, but instead from the polymer backbone and the efficiency thereof is consequently significantly lower than in copolymers according to the invention. The efficiency is also higher compared with blends of comparable polymers which do not comprise metal complexes with low-molecular-weight metal complexes.
- The lifetime is longer compared with copolymers in accordance with the prior art.
- Compared with phosphorescent mixtures in accordance with the prior art, the problem of separation of the components does not exist in the case of the phosphorescent copolymers according to the invention, resulting in more uniform light emission from the corresponding pixel.
- The phosphorescent polymers according to the invention have surprisingly high solubility and can therefore also be processed very well from solution.
- The phosphorescent polymers according to the invention are obtainable synthetically in a simple manner and in high yield, which is not the case for polymers in accordance with the prior art. Resource-conserving use of the rare metals in the triplet emitters is consequently possible.
- The polymers comprise fewer triplet emitters than polymers in accordance with the prior art. This makes a further contribution to resource-conserving use of the rare metals.

The present application text and the following examples are directed to the use of phosphorescent copolymers according to the invention in relation to PLEDs and the corresponding displays. In spite of this restriction of the description, it is possible for the person skilled in the art, without further inventive step, also to use the polymers according to the invention for further uses in other electronic devices, for example for organic solar cells (O-SCs), non-linear optics, organic optical detectors, organic field-quench devices (O-FQDs) or also organic laser diodes (O-lasers), to mention but a few applications. The present invention also relates to these.

The invention is explained in greater detail by the following examples without wishing it to be restricted thereby.

EXAMPLES

Example 1

Synthesis of the Iridium Compounds a) Synthesis of tris(3-bromophenylisoquinoline)iridium (Ir1)

The synthesis of monomer Ir1 was carried out by bromination of tris(phenylisoquinoline)iridium(III) as described in WO 02/068435.

b) Synthesis of bis(3-bromophenylisoquinoline)(phenylisoquinoline)iridium (Ir2) and of bis(3-bromophenylisoquinoline)(benzothienylpyridyl)iridium (Ir3)

The syntheses of monomers Ir2 and Ir3 were carried out as described in the unpublished application DE 10350606.3.

c) Synthesis of a Soluble Iridium Compound (Ir4)

The soluble variant of an iridium complex (Ir4) was obtained from monomer Ir1 by Suzuki coupling as described in WO 04/026886.

The structures of the iridium compounds are depicted again here for clarity:

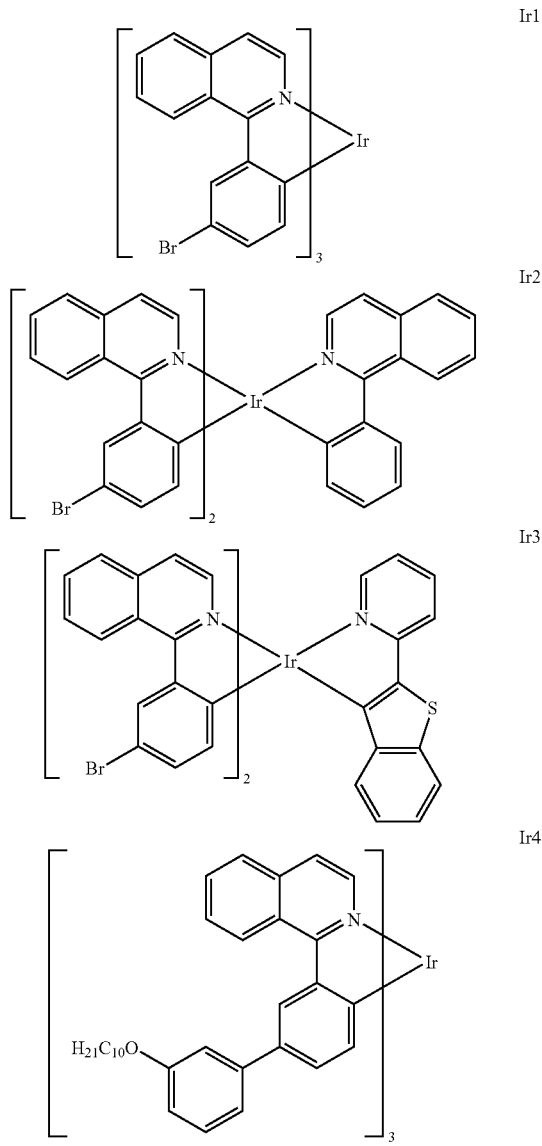

Example 2

Synthesis of Further Comonomers

The synthesis of the further comonomers and monofunctional compounds used is described in detail in WO 02/077060 and the literature cited therein. Comonomers M1 to M7 used below are depicted again here for clarity:

M1
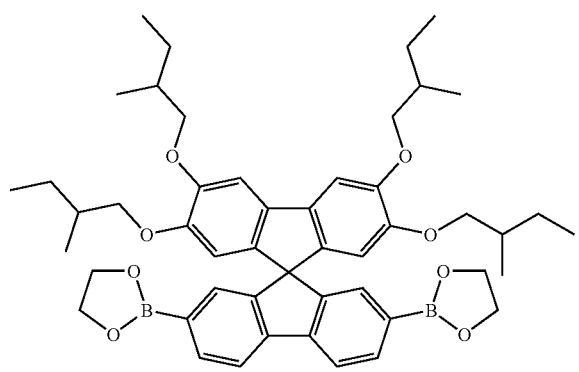
M2
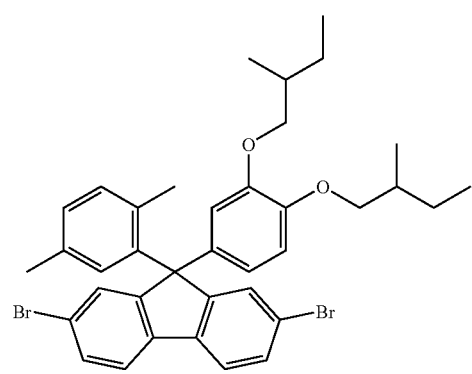
M3
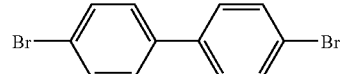
M4
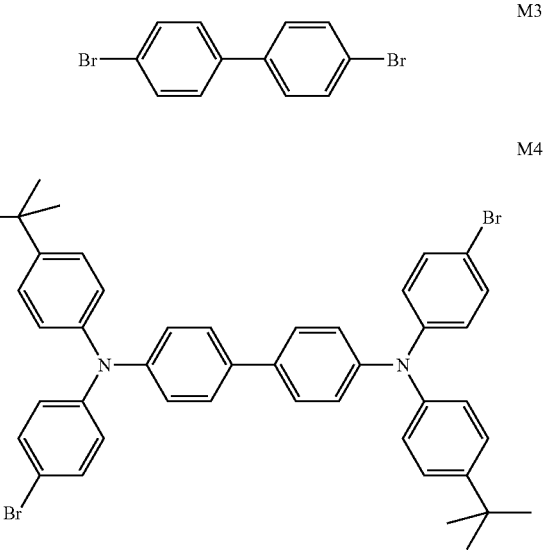
M5
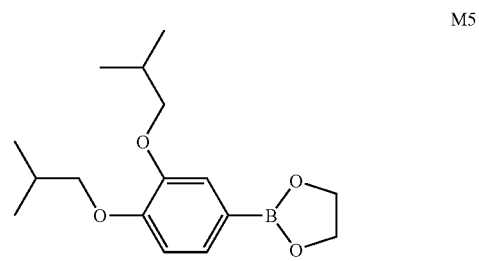
M6
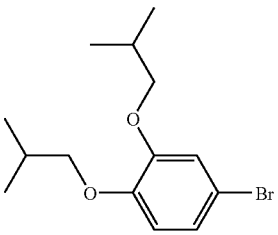
M7
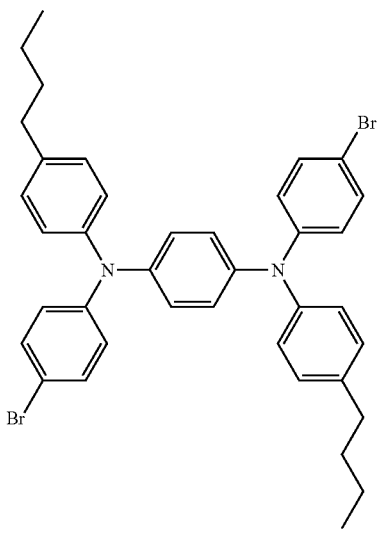
M8
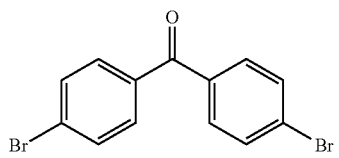
M9
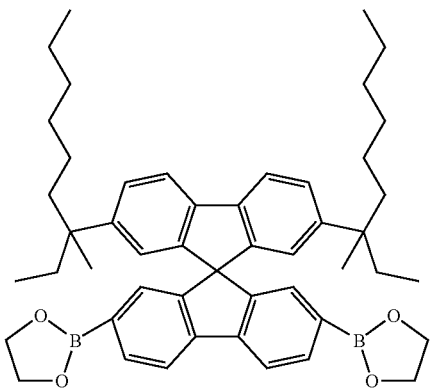
M10
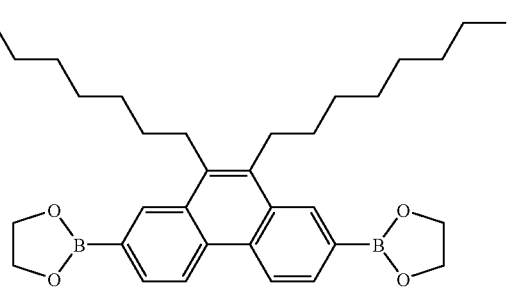

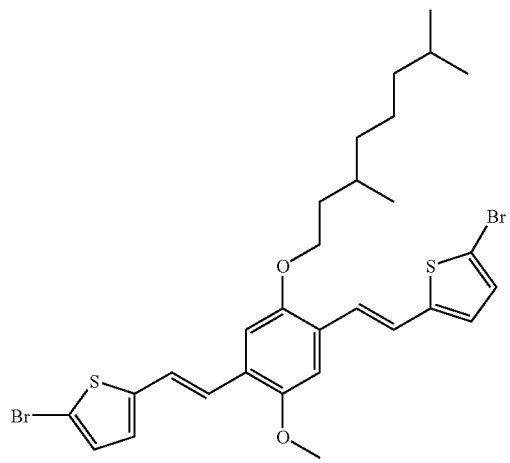

M11

Example 3

Synthesis of the Phosphorescent Copolymers According to the Invention

The polymers were synthesised by SUZUKI coupling, as described in general in WO 03/048225. The composition of the synthesised polymers P1 to P5 (Examples 5 to 9) and the comparative polymers or comparative blends C1 to C3 (Examples 10 to 13) is shown in Table 1 together with their physical properties.

Example 4

Production of Polymeric Light-Emitting Diodes (PLEDs)

The way in which PLEDs can be produced is described in detail in WO 04/037887 and the literature cited therein.

Examples 5 to 17

Device Examples

All polymers prepared were also investigated in PLEDs. The composition of the polymers and the electroluminescence results are shown in Table 1.

The comparative examples used are linear (unbranched) polymers obtained using a dibromo derivative of the iridium complex (Ir2 and Ir3). Also used as comparative examples are blends of a polymer which does not comprise a metal complex with a soluble variant of the iridium complex (Ir4) and with the tribrominated iridium monomer (Ir1).

TABLE 1

Device results with copolymers according to the invention and comparative polymers and blends

| Example | Polymer | Ir complex[a] | Other monomers[a] | Polydispersity | Max. eff./ cd/A | U @ 100 cd/m$^2$/V | CIE x/y[b] | Lifetime[c]/h |
|---|---|---|---|---|---|---|---|---|
| Example 5 | P1 | 1% Ir1 | 50% M1, 39% M2, 10% M4, 1.4% M5, 0.4% M6 | 4.1 | 6.1 | 4.14 | 0.68/0.32 | 108 |
| Example 6 | P2 | 1.5% Ir1 | 50% M1, 38.5% M2, 10% M4, 1.9% M5, 0.4% M6 | 5.3 | 4.9 | 4.70 | 0.68/0.32 | 169 |
| Example 7 | P3 | 1% Ir1 | 50% M1, 39% M3, 10% M4, 1.5% M5, 0.5% M6 | 5.1 | 5.0 | 4.65 | 0.68/0.32 | 214 |
| Example 8 | P4 | 1% Ir1 | 50% M1, 41% M2, 8% M4, 1.5% M5, 0.5% M6 | 7.5 | 6.7 | 4.65 | 0.67/0.32 | n.s. |
| Example 9 | P5 | 1% Ir1 | 50% M1, 39% M2, 10% M7, 1.5% M5, 0.5% M6 | 6.2 | 7.4 | 5.41 | 0.68/0.32 | 66[d] |
| Example 10 | P6 | 1% Ir1 | 50% M1, 29% M2, 10% M4, 10% M8, 1.5% M5, 0.5% M6 | 6.2 | 8.5 | 3.85 | 0.67/0.32 | 250[d] |
| Example 11 | P7 | 1% Ir1 | 50% M9, 26% M2, 8% M4, 15% M8, 1.5% M5, 0.5% M6 | 6.6 | 7.1 | 3.68 | 0.67/0.32 | 530[d] |
| Example 12 | P8 | 1% Ir1 | 50% M10, 35% M2, 6% M4, 8% M8, 1.5% M5, 0.5% M6 | 5.1 | 6.3 | 5.3 | 0.67/0.32 | 1300[d] |
| Example 13 | P9 | 0.02% Ir1 | 50% M1, 40% M2, 10% M4, 0.1% M11, 0.5% M5, 0.5% M6 | 2.9 | 7.4 | 3.9 | 0.35/0.39 | 130[d] |
| Example 14 (comparison) | C1 | 1% Ir2 | 50% M1, 39% M2, 10% M7 | 3.3 | 1.9 | 6.9 | 0.66/0.31 | 119[c] |
| Example 15 (comparison) | C2 | 1% Ir3 | 50% M1, 39% M2, 10% M7 | 3.2 | 4.3 | 5.2 | 0.68/0.32 | 50 |
| Example 16 (comparison) | C3 | 8% by wt. Ir4 (mixed in) | 50% M1, 40% M2, 10% M7 | 2.8 | 4.5 | 4.8 | 0.68/0.32 | n.s. |
| Example 17 (comparison) | C3 | 1 mol % Ir1 (mixed in) | 50% M1, 40% M2, 10% M7 | 2.8 | 3.0 | 6.5 | 0.67/0.33 | 1 |

[a]The proportions of the monomers are in mol %, based on all recurring units present in the polymer.
[b]CIE coordinates: chromaticity coordinates of the Commission Internationale de l'Eclairage from 1931
[c]The lifetime here is defined as the time in which the luminous density of the light-emitting diode has dropped to half the initial luminous density at a current density of 10 mA/cm$^2$
[d]The lifetime here was not measured at a current density of 10 mA/cm$^2$, but instead at an initial brightness of 800 cd/m$^2$.

As can readily be seen from Table 1, the polymers according to the invention have significantly higher efficiencies and lower voltages at the same time as a longer lifetime than comparative polymers and comparative blends. Thus, it is evident, for example, that, in particular, comparative polymer C1 from Example 10 has a significantly lower efficiency at the same time as a significantly higher operating voltage compared with polymer P1 according to the invention, which has a comparable structure apart from the branch. The effect also occurs in the case of comparative polymer C2; here, the lifetime is also shorter by a factor of greater than two. In a comparable blend (Example 12, iridium complex Ir4 in polymer C3), it is evident that a significantly higher proportion of the iridium compound is required for acceptable efficiencies, with the efficiencies still being lower than in the polymer according to the invention. Comparative Example 13 (Ir1 mixed into comparative polymer C3) shows that monomer Ir1 is in fact covalently bonded to the polymer in the polymers according to the invention since the efficiency in this comparative blend is significantly lower, the voltage significantly higher and the lifetime shorter by a factor of greater than 100.

The invention claimed is:

1. A phosphorescent copolymer comprising 0.01 to 10 mol % of at least one triplet emitter, and comonomers wherein the triplet emitter has at least three links to the polymer, with the proviso that the polymer does not comprise 9,9-dioctylfluorene if the triplet emitter is an unsubstituted tris(phenylpyridine)iridium(III) and wherein monofunctional compounds are added to the at least one triplet emitter and said comonomers prior to polymerization.

2. The phosphorescent copolymer according to claim 1, wherein the copolymer is conjugated or partially conjugated.

3. The phosphorescent copolymer according to claim 1, wherein the copolymer comprises further structural elements.

4. The phosphorescent copolymer according to claim 3, wherein the further structural elements form the polymer backbone and are selected from fluorene derivatives, spirobifluorene derivatives, 9,10-dihydrophenanthrene derivatives, 4,5-dihydropyrene derivatives, 4,5,9,10-tetrahydropyrene derivatives, phenanthrene derivatives and cis- and trans-indenofluorene derivatives.

5. The phosphorescent copolymer according to claim 4, wherein one of the structural elements is a spirobifluorene derivative or a phenanthrene derivative.

6. The phosphorescent copolymer according to claim 3, wherein the structural elements have hole-transport properties and are selected from the group of the triarylamine derivatives, benzidine derivatives, tetraarylene-para-phenylenediamine derivatives, triarylphosphine derivatives, phenothiazine derivatives, phenoxazine derivatives, dihydrophenazine derivatives, thianthrene derivatives, dibenzo-p-dioxin derivatives, phenoxathiyne derivatives, carbazole derivatives, azulene derivatives, thiophene derivatives, pyrrole derivatives, furan derivatives and further O-, S- or N-containing heterocycles having a high highest occupied molecular orbit (HOMO).

7. The phosphorescent copolymer according to claim 3, wherein the structural elements have electron-transport properties and are selected from the group of the pyridine derivatives, pyrimidine derivatives, pyridazine derivatives, pyrazine derivatives, anthracene derivatives, pyrene derivatives, triarylboranes, oxadiazole derivatives, quinoline derivatives, quinoxaline derivatives, phenazine derivatives and further O-, S- or N-containing heterocycles having a low lowest unoccupied molecular orbit (LUMO).

8. The phosphorescent copolymer according to claim 3, wherein the structural elements improve the transition from the singlet state to the triplet state and are selected from the group of the carbazoles, the ketones, the phosphine oxides, the sulfoxides and the arylsilanes.

9. The phosphorescent copolymer according to claim 8, wherein the structural elements are selected from aromatic ketones and aromatic phosphine oxides.

10. White-emitting phosphorescent copolymers in which the white emission is a combination of the emission from blue-, green- and red-emitting units, characterised in that at least one of the emitting units is a triplet emitter which has at least three links to the polymer.

11. The phosphorescent copolymer according to claim 1, wherein wherein the copolymer is obtained by incorporation of the correspondingly trifunctionalised triplet emitter as monomer.

12. The phosphorescent copolymer according to claim 1, wherein the copolymer involves organometallic triplet emitters.

13. The phosphorescent copolymer according to claim 1, wherein the triplet emitters comprise exclusively chelating ligands.

14. The phosphorescent copolymer according to claim 1, wherein the triplet emitter has a structure of the formula (1)

formula (1)

where the following applies to the symbols and indices used:

M is on each occurrence, identically or differently, a main-group metal, transition metal or lanthanoid having an atomic number >38;

DCy is on each occurrence, identically or differently, a cyclic group which contains at least one donor atom via which the cyclic group is bonded to the metal and which may carry one or more substituents $R^1$; the groups DCy and CCy are bonded to one another via a covalent bond and may also have further links to one another via the radicals $R^1$ and $R^2$;

CCy is on each occurrence, identically or differently, a cyclic group which contains a carbon atom via which the cyclic group is bonded to the metal and which may carry one or more substituents $R^1$;

L is on each occurrence, identically or differently, a bidentate-chelating ligand;

$R^1$ is on each occurrence, identically or differently, H, F, Cl, Br, I, $NO_2$, CN, a straight-chain, branched or cyclic alkyl or alkoxy group having 1 to 40 C atoms, in which one or more non-adjacent $CH_2$ groups may be replaced by C=O, C=S, C=Se, C=$NR^2$, —$R^2$C=$CR^2$—, —C≡C—, —O—, —S—, —$NR^2$—, Si($R^2$)$_2$ or —CONR$^2$— and in which one or more H atoms may be replaced by F, Cl, Br, I, CN, $NO_2$, or an aromatic or heteroaromatic ring system having 5 to 40 aromatic ring atoms, which may be substituted by one or more non-aromatic radicals $R^1$; a plurality of substituents $R^1$ here, both on the same ring and also on the two different rings, may together in turn define a further mono- or polycyclic, aliphatic or aromatic ring system;

$R^2$ is, identically or differently on each occurrence, H or an aliphatic or aromatic hydrocarbon radical having 1 to 20 C atoms;

m is on each occurrence 1, 2 or 3;

n is on each occurrence 0, 1 or 2;

the unit of the formula (1) has at least three links to the polymer.

15. The phosphorescent copolymer according to claim 14, wherein the index m=2 or 3 and the index n=0.

16. The phosphorescent copolymer according to claim 14, wherein the units of the formula (1) have a symmetrical structure.

17. The phosphorescent copolymer according to claim 14, wherein the units of the formula (1) have an asymmetrical structure.

18. The phosphorescent copolymer according to claim 14, wherein the metal M of the triplet emitter is selected from the group of the transition metals having an atomic number >38.

19. The phosphorescent copolymer according to claim 18, wherein the metal M of the triplet emitter is selected from the elements tungsten, rhenium, ruthenium, osmium, rhodium, iridium, palladium, platinum and gold.

20. The phosphorescent copolymer according to claim 1, wherein the linking to the polymer takes place via at least three ligands.

21. Blends of one or more copolymers according to claim 1, with one or more conjugated, partially conjugated or non-conjugated polymers, oligomers, dendrimers or low-molecular-weight compounds.

22. Solutions and formulations of one or more of the copolymers or blends according to claim 1 in one or more solvents.

23. Organic electronic device having one or more layers, where at least one of these layers comprises at least one copolymer or blend according to claim 1.

24. Organic electronic device according to claim 23, characterised in that it is an organic or polymeric light-emitting diode, organic solar cell, non-linear optic, organic optical detector, organic field-quench device or organic laser diode.

25. The phosphorescent copolymer according to claim 14, wherein
DCy is on each occurrence, identically or differently, a cyclic group which contains at least one nitrogen or phosphorus atom, via which the cyclic group is bonded to the metal and which may carry one or more substituents $R^1$; the groups DCy and CCy are bonded to one another via a covalent bond and may also have further links to one another via the radicals $R^1$ and $R^2$; and
L is on each occurrence, identically or differently, a monoanionic, bidentate-chelating ligand.

26. Phosphorescent copolymers according to claim 1, wherein the copolymers comprise from 0.05 to 10 mol % of at least one triplet emitter.

27. Phosphorescent copolymers according to claim 1, wherein the copolymers comprise from 0.1 to 5 mol % of at least one triplet emitter.

28. A phosphorescent copolymer which comprises a copolymer that has been produced by the polymerization of 0.01 to 10 mol % of at least one triplet emitter, comonomers and monofunctional compounds wherein the triplet emitter has at least three links to the polymer, with the proviso that the polymer does not comprise 9,9-dioctylfluorene if the triplet emitter is an unsubstituted tris(phenylpyridine)iridium(III).

29. A phosphorescent copolymer which comprises 0.01 to 10 mol % of at least one triplet emitter, comonomers and monofunctional compounds wherein at least 20% of the triplet emitter has at least three links to the polymer chain, and wherein monofunctional compounds are added to the at least one triplet emitter and said comonomers prior to polymerization.

30. A process to produce a phosphorescent copolymer which comprises polymerizing at least one triplet emitter, comonomers and monofunctional compounds wherein at least 20% of the triplet emitter has three links to the polymer chain.

31. The copolymer as claimed in claim 30, wherein at least 50% of the triplet emitter has at least three links to the polymer chain.

32. The copolymer as claimed in claim 30, wherein predominately all of the triplet emitters have at least three links to the polymer chain.

33. The copolymer as claimed in claim 30, wherein only the triplet emitters and no further units in the polymer have branches.

34. The process as claimed in claim 31, wherein at least 50% of the triplet emitter has at least three links to the polymer chain.

35. The process as claimed in claim 31, wherein predominately all of the triplet emitters have at least three links to the polymer chain.

36. A phosphorescent copolymer which comprises 0.01 to 10 mol % of at least one triplet emitter, at least one comonomer and at least one monofunctional compound wherein at least 20% of the triplet emitter has at least three links to the polymer chain, and wherein at least one monofunctional compound is added to the at least one triplet emitter and said at least one comonomer prior to polymerization.

* * * * *